United States Patent
Chen et al.

(10) Patent No.: US 8,238,115 B2
(45) Date of Patent: Aug. 7, 2012

(54) COMPUTER MOTHERBOARD

(75) Inventors: Yung-Chieh Chen, Taipei Hsien (TW);
Cheng-Hsien Lee, Taipei Hsien (TW);
Shou-Kuo Hsu, Taipei Hsisen (TW);
Shen-Chun Li, Taipei Hsien (TW);
Hsien-Chuan Liang, Taipei Hsien (TW); Shin-Ting Yen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 210 days.

(21) Appl. No.: 12/824,850

(22) Filed: Jun. 28, 2010

(65) Prior Publication Data

US 2011/0271025 A1   Nov. 3, 2011

(30) Foreign Application Priority Data

Apr. 28, 2010   (TW) ................................ 99113585 A

(51) Int. Cl.
*H05K 1/11* (2006.01)
*H05K 1/14* (2006.01)
*G06F 13/00* (2006.01)

(52) U.S. Cl. ........ 361/785; 361/784; 361/803; 361/809; 711/103; 711/104; 711/105; 710/300; 710/301; 710/104; 710/122; 365/58; 365/78; 365/164; 174/250; 174/260

(58) Field of Classification Search ............. 361/679.02, 361/737, 748, 752, 756, 782–788, 792–795, 361/803–809; 174/250–267; 710/300–310, 710/104, 122, 110; 711/103–105, 115, 154, 711/E12.084, 167–170; 365/51–53, 58, 59, 365/78, 164, 63, 233.13, 230.02–230.05
See application file for complete search history.

(56) References Cited

U.S. PATENT DOCUMENTS

| | | | | |
|---|---|---|---|---|
| 7,133,297 | B2 * | 11/2006 | Yu et al. | 361/803 |
| 8,031,504 | B2 * | 10/2011 | Chen | 365/51 |
| 2002/0023187 | A1 * | 2/2002 | Chang et al. | 710/301 |
| 2010/0070694 | A1 * | 3/2010 | Chin | 711/104 |
| 2011/0197005 | A1 * | 8/2011 | Liao et al. | 710/301 |

* cited by examiner

*Primary Examiner* — Michail V Datskovskiy
(74) *Attorney, Agent, or Firm* — Altis Law Group, Inc.

(57) ABSTRACT

A computer motherboard includes a printed circuit board which includes a central processing unit (CPU) socket and a group of memory slots. The group of memory slots includes an in-line type memory slot and a surface mounted device (SMD) type memory slot. The in-line type memory slot includes a number of plated through holes. The SMD type memory slot is set between the in-line type memory slot and the CPU socket. The through holes of the in-line type memory slot are connected to the CPU socket through traces, pads of the SMD type memory slot are connected to corresponding through holes of the in-line type memory slot having the same pin definition.

2 Claims, 3 Drawing Sheets

COMPUTER MOTHERBOARD

BACKGROUND

1. Technical Field

The present disclosure relates to computer motherboards, and more particularly to a computer motherboard operable to improve signal quality.

2. Description of Related Art

Commonly, a computer motherboard includes several memory slots side by side for mounting memory modules. The memory slots often employ in-line type packaging, so traces connecting one of the memory slots to a CPU socket must extend between through holes of other memory slots closer to the CPU socket. Since space between the through holes of the memory slots is limited, traces may be too dense causing signal interference between different traces. In order to avoid signal interference, space between the traces can be increased, however, if the traces are laid out too close to the through holes of the memory slots, edges of the traces adjacent to the through holes will not be smooth, resulting in impedance mismatch of the traces, which can cause signal reflection.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
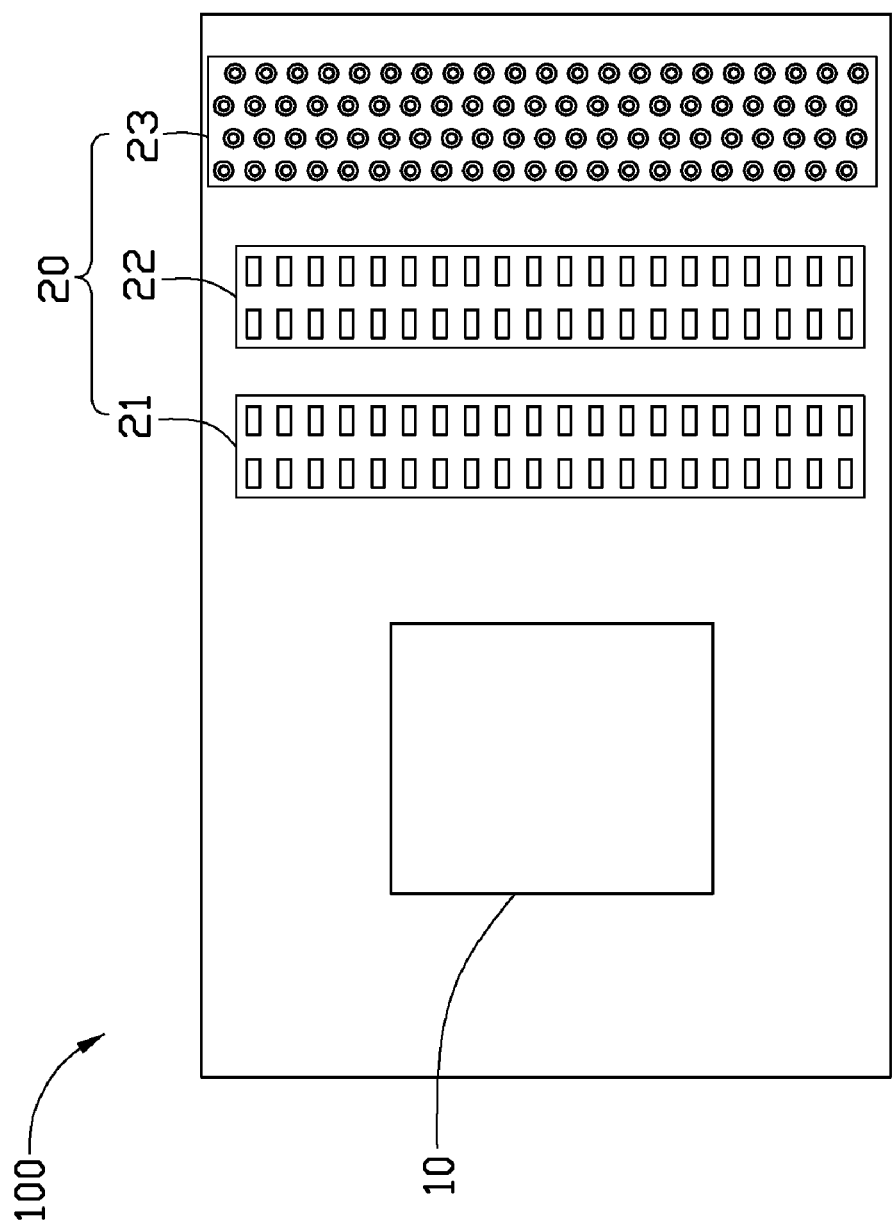
FIG. 1 is a top plan view of an exemplary embodiment of a computer motherboard including a central processing unit (CPU) socket, two surface mounted device (SMD) type memory slots, and an in-line type memory slot.

Referring to FIG. 1, an exemplary embodiment of a computer motherboard includes a multilayer printed circuit board (PCB) 100. The PCB 100 includes a central processing unit (CPU) socket 10 and a group of memory slots 20. The group of memory slots 20 includes first to third memory slots 21-23 arranged side by side. The first and second memory slots 21 and 22 are surface mounted device (SMD) type slots, and the third memory slot 23 is an in-line type slot. The first and second memory slots 21 and 22 are arranged between the third memory slot 23 and the CPU socket 10.

Figure 2:
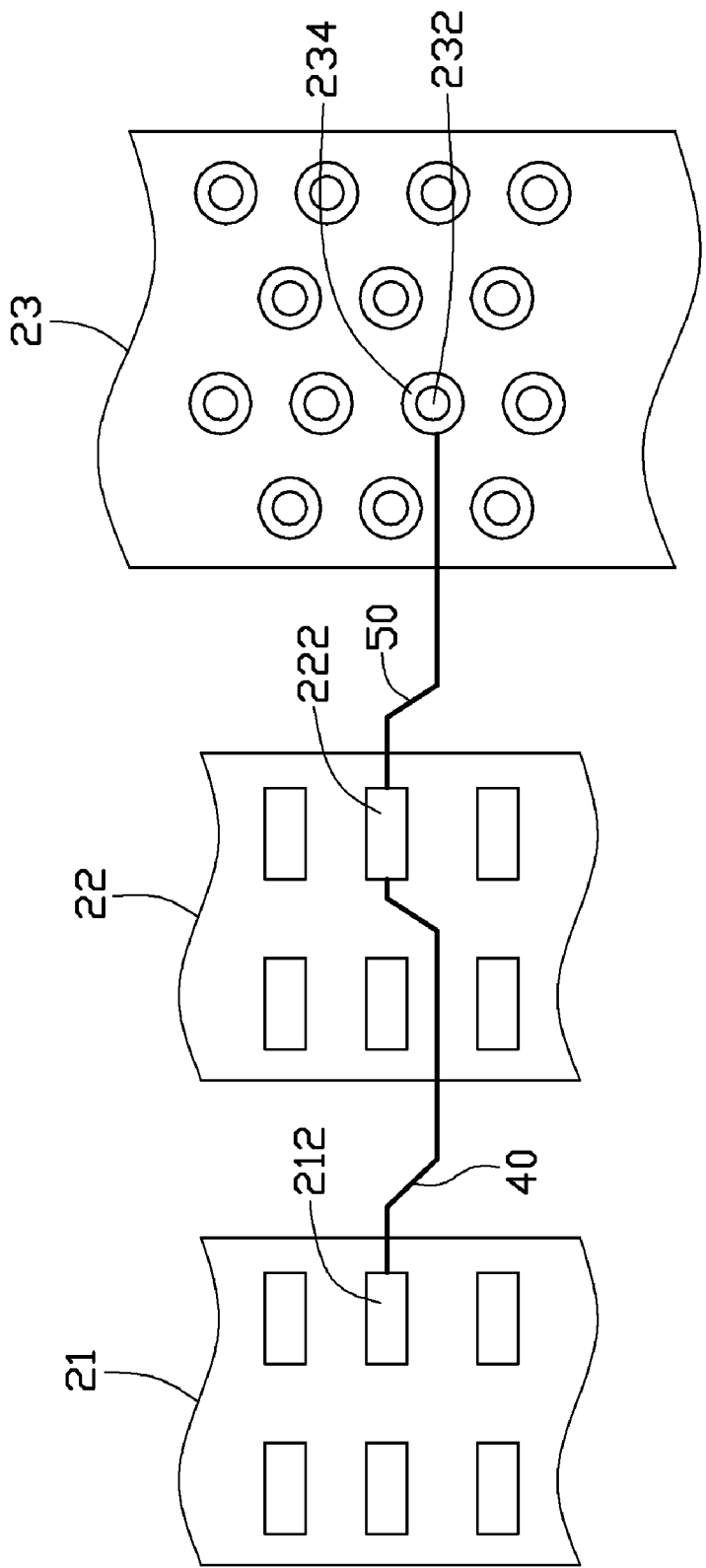
FIG. 2 is an enlarged partial view of the in-line type memory slot and the SMD type memory slots of FIG. 1.
Figure 3:
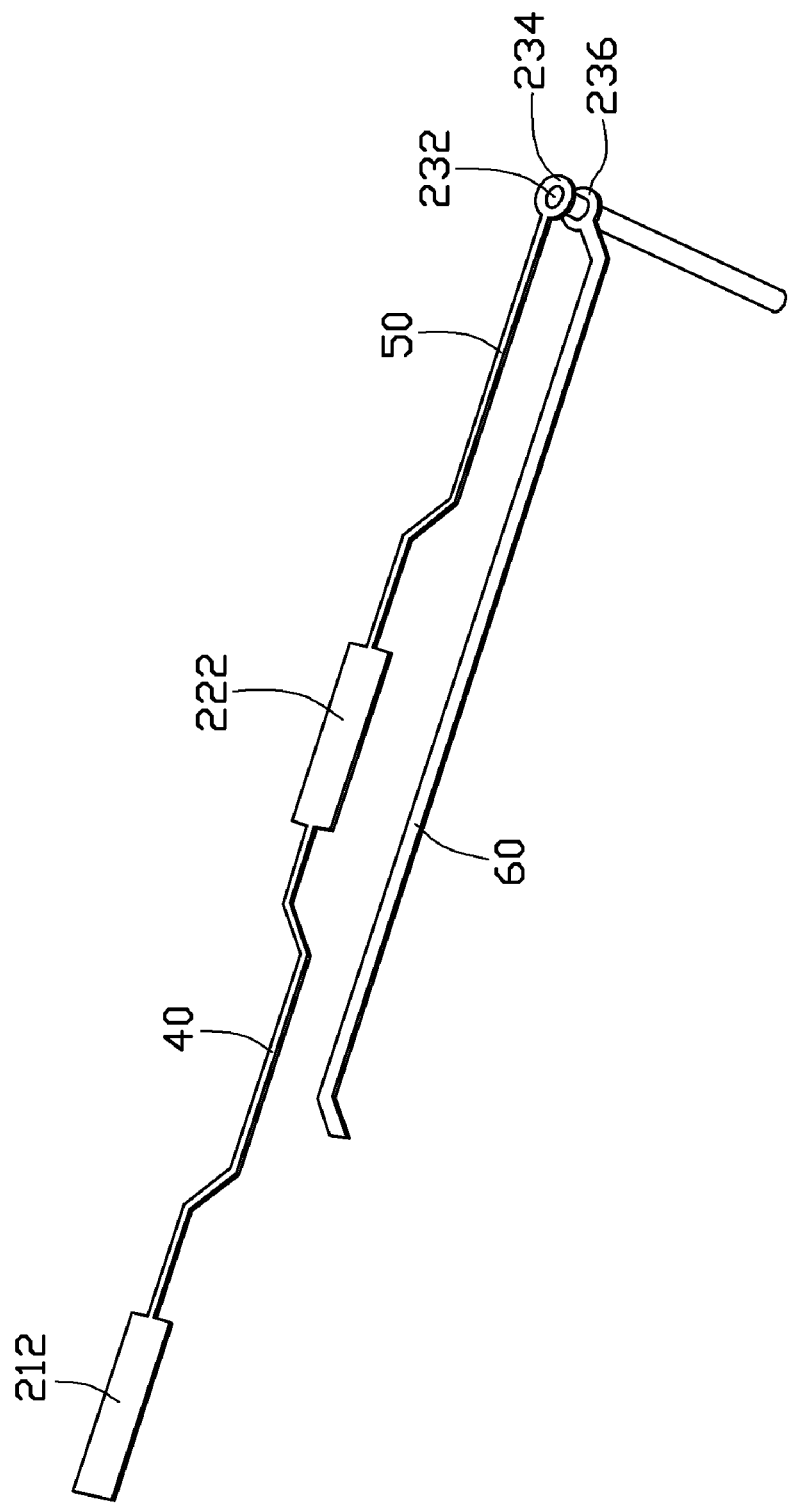
FIG. 3 is an isometric view of an exemplary embodiment of the plated through hole of the in-line type memory slot connected to pads of the SMD type memory slots and traces of the through hole connected to the CPU socket.

Referring to FIGS. 2 and 3, each of the first and second memory slots 21 and 22 includes a plurality of pads, the third memory slot 23 includes a plurality of conductive through holes. The pads of the first and second memory slots 21 and 22 have the same pin definition as the through holes of the third memory slot 23. In one embodiment, the pad 212 of the first memory slot 21 is connected to the pad 222 of the second memory slot 22 through a first trace 40, the pad 222 of the second memory slot 22 is connected to plating 234 of the through hole 232 of the third memory slot 23 through a second trace 50 on a surface layer of the PCB 100. Plating 236 of the through hole 232 on a middle layer of the PCB 100 is connected to a pad of the CPU socket 10 through a third trace 60, the pad of the CPU socket 10 is configured to transfer signals between a CPU mounted in the CPU socket 10 and a memory mounted in one of the first and second memory slots 21 and 22.

In use, when not all of the first to third memory slots 21-23 need to be used, the first to third memory slots 21-23 should be used in order from the first memory slot 21 to third memory slot 23. For example, when only one memory module is to be used, the memory module should be inserted into the first memory slot 21 and the second and third memory slots 22 and 23 left empty. So signals transferred between the first memory slot 21 and the CPU socket 10 always pass through the pads of the second memory slot 22, avoiding signal reflection on the pads of the memory slot 22 due to pad stub effect when the second memory slot 22 is left empty.

In other embodiments, the PCB 100 may include several groups of memory slots 20, and a number of SMD type memory slots in each group of memory slots may be regulated according to need. Since each group of memory slots includes only one in-line type memory slot, traces connecting the CPU socket to each group of memory slots go through only one in-line type memory slot, saving space for layout to ensure the traces are smooth and impedance matched, to reduce signal reflection. Because the in-line type memory slot of each group of memory slots is positioned furthest from the CPU socket 10 relative to the SMD type memory slots of the group of memory slots, traces extending between the through holes of the in-line slot 23 near to the CPU socket 10 is avoided.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A computer motherboard comprising:
a printed circuit board comprising a central processing unit (CPU) socket and at least one group of memory slots, each group of memory slots includes an in-line type memory slot and at least one surface mounted device (SMD) type memory slot, wherein the in-line type memory slot includes a plurality of plated through holes attached thereto the SMD type memory slot is set between the in-line type memory slot and the CPU socket, the plating of the through holes of the in-line type memory slot are connected to the CPU socket through traces, pads of the SMD type memory slot are connected to corresponding plating of the through holes of the in-line type memory slot having the same pin definition.

2. The computer motherboard of claim 1, wherein the at least one group of memory slots comprises two SMD type memory slots, pads of the SMD type memory slot are connected to corresponding plating of the through holes of the in-line type memory slot having the same pin definition in series.

* * * * *